(12) United States Patent
Thomas

(10) Patent No.: US 6,753,689 B1
(45) Date of Patent: Jun. 22, 2004

(54) RF CONFIGURATION IN A PLASMA PROCESSING SYSTEM

(75) Inventor: George Thomas, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/178,659

(22) Filed: Jun. 24, 2002

(51) Int. Cl.[7] .......................... G01R 27/32; H01L 21/66; H05H 1/36
(52) U.S. Cl. ...................... 324/633; 324/668; 324/688; 438/17; 118/712; 118/723 E; 315/111.21
(58) Field of Search ................................. 324/633, 639, 324/652–655, 76.45, 668, 688, 96; 333/211, 212; 315/111.21; 118/712, 723 E; 438/17

(56) References Cited

U.S. PATENT DOCUMENTS

| | | | | |
|---|---|---|---|---|
| 4,812,712 A | * | 3/1989 | Ohnishi et al. | ............. 315/176 |
| 6,063,234 A | * | 5/2000 | Chen et al. | ............. 156/345.27 |
| 6,361,645 B1 | * | 3/2002 | Schoepp et al. | ............. 361/234 |
| 6,577,113 B2 | * | 6/2003 | Sill et al. | ................... 324/72.5 |
| 6,630,792 B2 | * | 10/2003 | Okumura | ............... 315/111.21 |

* cited by examiner

*Primary Examiner*—Anjan K. Deb
(74) *Attorney, Agent, or Firm*—Okamoto & Benedicto LLP (57) ABSTRACT

In one embodiment, a radio frequency (RF) configuration in a plasma processing system includes an RF electrode driven by an RF signal source and a non-RF electrode coupled to an electronic module. A filter coupled to the non-RF electrode is configured to provide maximum attenuation at or near an RF signal frequency, while allowing signals associated with the electronic module to pass. The filter may be placed as close to the non-RF electrode as possible. The filter may be, for example, a band stop filter such as a parallel resonant circuit having a resonant frequency at or near an RF signal frequency.

20 Claims, 8 Drawing Sheets

RF CONFIGURATION IN A PLASMA PROCESSING SYSTEM

BACKGROUND OF THE INVENTION

1. Field of the Invention

The present invention relates generally to integrated circuit manufacturing equipment, and more particularly but not exclusively to plasma processing systems.

2. Description of the Background Art

A plasma processing system may be used to fabricate integrated circuits. Examples of plasma processing systems include physical vapor deposition, plasma-enhanced chemical vapor deposition, high density plasma chemical vapor deposition, and etching systems. In a plasma processing system, radio frequency (RF) signal source is employed to ignite and maintain plasma inside a process chamber containing one or more substrates. The RF signal source is typically coupled to the process chamber by an electrode, referred to as an "RF electrode". The RF electrode may be located inside a vacuum portion of the plasma processing system such as the interior of the chamber, or in an atmospheric portion near the chamber. Other electrodes, referred to as "non-RF electrodes", may also be in the same general location as the RF electrodes.

Figure 1:
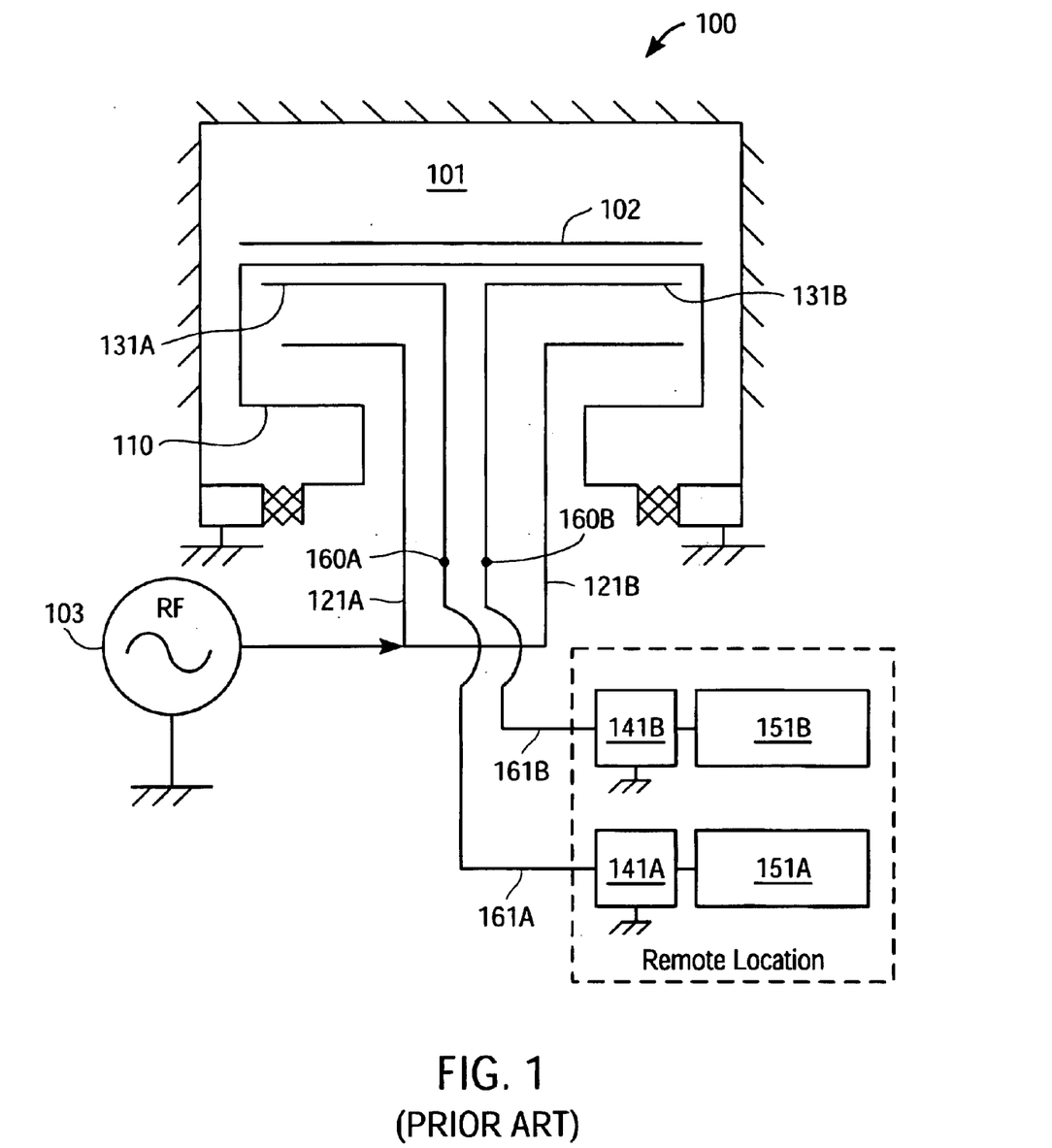
FIG. 1 schematically shows a conventional plasma processing system.

FIG. 1 schematically shows a conventional plasma processing system 100. System.100 includes a process chamber 101 containing a substrate 102. Substrate 102 is supported by a support member 110, which is also inside process chamber 101. An RF signal source 103 drives RF electrodes 121 (i.e., 121A, 121B) with an RF signal required for process chamber 101. RF electrodes 121 are inside support member 110 along with non-RF electrodes 131 (i.e., 131A, 131B), which may be coupled to remotely located electronic modules 151 (i.e., 151A, 151B). Examples of electronic modules 151 include power supplies, controllers, and the like. A non-RF electrode 131 may be connected to a cable 161 (i.e., 161A, 161B) at a terminal 160 (i.e., 160A, 160B). A cable 161 in turn may be connected to a filter 141 (i.e., 141A, 141B), which is connected to an electronic module 151.

If precautions are not taken, RF signal may reach an electronic module 151 by way of a non-RF electrode 131. Accordingly, a filter 141 is typically employed to prevent damaging an electronic module 151. Typically, a filter 141 is a low-pass filter that shunts high frequency signals to ground. A filter 141 is also typically installed near an electronic module 151, which may be several feet away from chamber 101.

SUMMARY

In one embodiment, a radio frequency (RF) configuration in a plasma processing system includes an RF electrode driven by an RF signal source and a non-RF electrode coupled to an electronic module. A filter coupled to the non-RF electrode may be configured to provide maximum attenuation at or near an RF signal frequency, while allowing signals associated with the electronic module to pass. The filter may be placed as close to the non-RF electrode as possible. The filter may be, for example, a band stop filter such as a parallel resonant circuit having a resonant frequency at or near an RF signal frequency.

These and other features of the present invention will be readily apparent to persons of ordinary skill in the art upon reading the entirety of this disclosure, which includes the accompanying drawings and claims.

DESCRIPTION OF THE DRAWINGS

The use of the same reference label in different drawings indicates the same or like components. Drawings are not to necessarily to scale unless otherwise noted.

DETAILED DESCRIPTION

In the present disclosure, numerous specific details are provided such as examples of apparatus, circuits, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 2:
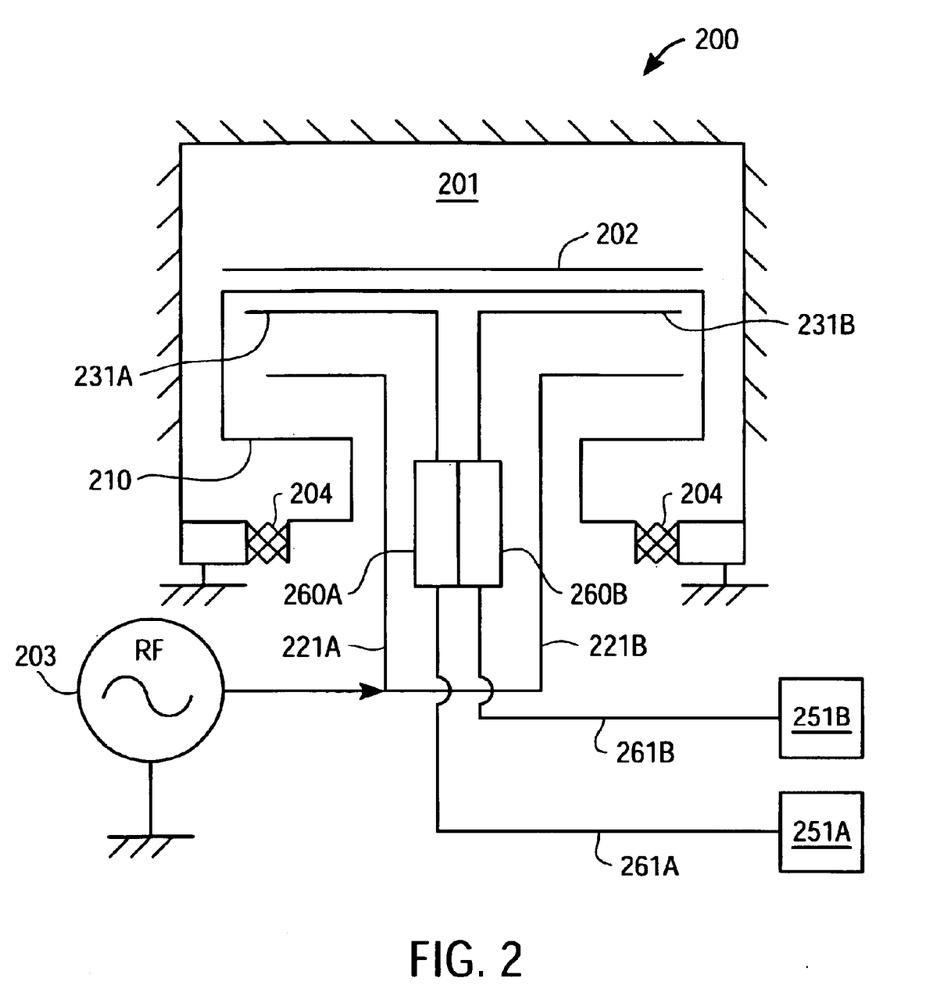
FIG. 2 schematically shows a plasma processing system in accordance with an embodiment of the present invention.

Referring now to FIG. 2, there is shown a schematic diagram of a plasma processing system 200 in accordance with an embodiment of the present invention. System 200 may be, without limitation, a physical vapor deposition, a plasma-enhanced chemical vapor deposition, a high density chemical vapor deposition, or an etching system. System 200 includes an RF signal source 203, which may be a commercially available RF generator (used in conjunction with a matching network that is not shown) employed in the semiconductor industry. RF signal source 203 drives RF electrodes 221 (i.e., 221A, 221B) with an RF signal to provide RF energy to a process chamber 201. As used in the present disclosure, the term "RF signal" includes signals having a frequency between 10 KHz to 300 GHz. In one embodiment, RF signal source 203 drives RF electrodes 221 with an RF signal that has a frequency of 13.56 MHz. In the example of FIG. 2, RF electrodes 221 are embedded inside a support member 210, which supports a substrate 202. In one embodiment, support member 210 is electrically isolated from the surface of chamber 201 using an insulator 204 (e.g., ceramic material). Support member 210 may be a pedestal with an electro-static chuck, for example. Substrate 202 may be a semiconductor wafer.

In accordance with an embodiment of the present invention, the RF configuration of system 200 not only includes RF electrodes 221, but also includes one or more non-RF electrodes 231 (i.e., 231A, 231B) with a filter 260. In the example of FIG. 2, non-RF electrodes 231 are placed closer to substrate 202 than RF-electrodes 221. A filter 260 may be connected to an end of a non-RF electrode 231 as shown in FIG. 2. As used in the present disclosure, the term "non-RF electrode" refers to an electrically conductive material that is not directly driven by an RF energy source.

A non-RF electrode 231 may be coupled to an electronic module 251 (i.e., 251A, 251B) via a filter 260 and a cable 261. In one embodiment, a cable 261 is a shielded cable assembly. In the example of FIG. 2, an end of a non-RF electrode 231 is connected to a filter 260, which is connected to a cable 261, which in turn is connected to an electronic module 251. A signal transmitted between a non-RF electrode 231 and an electronic module 251 is hereinafter referred to as a "non-RF signal". Examples of an electronic module 251 include power supplies, controllers, sensor modules, etc. In one embodiment, an electronic module 251 is a power supply for powering-up an electro-static chuck of a support member 210. Examples of a non-RF signal include a heater signal for a heater electronic module, a control signal for a controller electronic module, a voltage signal for a power supply electronic module, etc.

In one embodiment, a filter 260 is a band stop filter. Generally speaking, a band stop filter attenuates (usually to very low levels) signals having a frequency that is within a band of frequencies. That is, a band stop filter appears as high impedance to signals whose frequency is within the band, but as relatively low impedance to signals whose frequency is outside the band. In accordance with an embodiment of the present invention, a filter 260 may be configured such that it attenuates RF signals but allows non-RF signals to pass. For example, a filter 260 may be configured to attenuate signals within a band of frequencies that includes the RF signal frequency, and to allow passage of non-RF signals like those ordinarily utilized by an electronic module 251.

In accordance with an embodiment of the present invention, a filter 260 may be placed as close to a non-RF electrode 231 as possible. Filter 260 may be configured such that it has maximum impedance at a particular signal frequency (e.g., a resonant frequency) and high impedance over a band of frequencies. Filter 260 may thus help prevent an RF signal from reaching an electronic module 251. This not only solves personnel safety related issues, but also minimizes the amount of RF signal i from entering the electronic module 251 coupled to non-RF electrode, enables more of the RF signal to be maintained in the chamber for processing the substrate, and provides good plasma stability.

In one embodiment, a filter 260 is a parallel resonant circuit. A parallel resonant circuit may be configured as a band stop filter having maximum impedance at a resonant frequency. The resonant frequency ($f_r$) of a parallel resonant circuit is given by equation 1 below, while the Q-factor of a parallel resonant circuit is given by equation 2.

$$f_r = \frac{1}{2\prod \sqrt{LC}} \quad \text{(EQ. 1)}$$

$$Q_{factor} = \frac{2\prod f_r L}{R} \quad \text{(EQ. 2)}$$

Figure 3A:
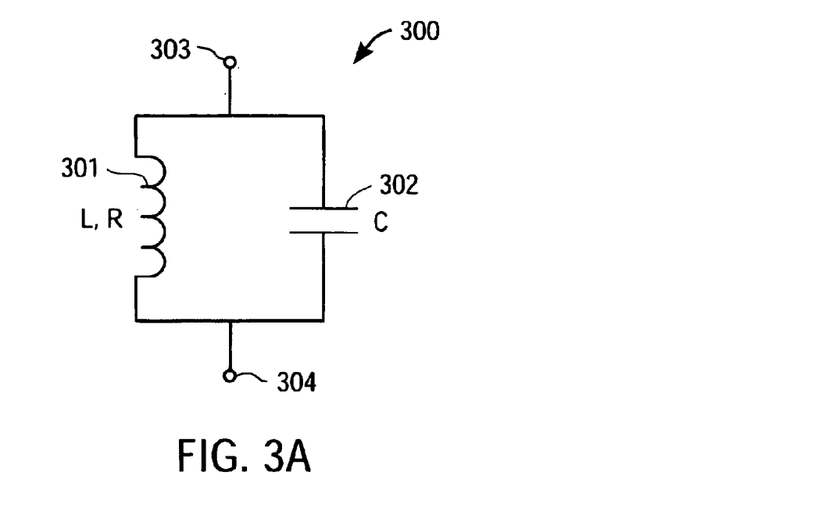
FIG. 3A schematically shows a parallel resonant circuit that may be used as a filter in accordance with an embodiment of the present invention.

FIG. 3A schematically shows a parallel resonant circuit 300 that may be used as a filter 260 in accordance with an embodiment of the present invention. Circuit 300 includes a terminal 303 that may be connected to an end of a non-RF electrode, and a terminal 304 that may be connected to a cable leading to an electronic module. Using FIG. 2 as an example, a non-RF electrode 231 may be connected to terminal 303, while a cable 261 may be connected to a terminal 304.

Referring back to FIG. 3A, circuit 300 also includes an inductor 301 and a capacitor 302. In EQ. 1, "L" is inductor 301 and "C" is capacitor 302. Although not specifically shown, an inductor 301 typically has a series resistance referred to herein as "inductor series loss resistance". In EQ. 2, "R" is the inductor series loss resistance of inductor 301, "L" is inductor 301, and "C" is capacitor 302.

In a parallel resonant circuit, one end of the circuit develops maximum voltage while the opposite end develops negligible voltage. Using circuit 300 as an example, large circulating currents in the circuit result in maximum voltage at terminal 303 (also referred to as the "hot side" with direct RF signal waveform exposure) and minimum voltage at terminal 304 (also referred to as the "cold side"). This is particularly advantageous in RF configurations where a non-RF electrode with a circuit 300 is closer to a substrate than an RF-electrode. The maximum voltage on the hot side of the circuit 300 increases voltage near the substrate, which in turn provides benefits such as increased ion bombardment and re-acceleration of ions for substrate processing.

Figure 3B:
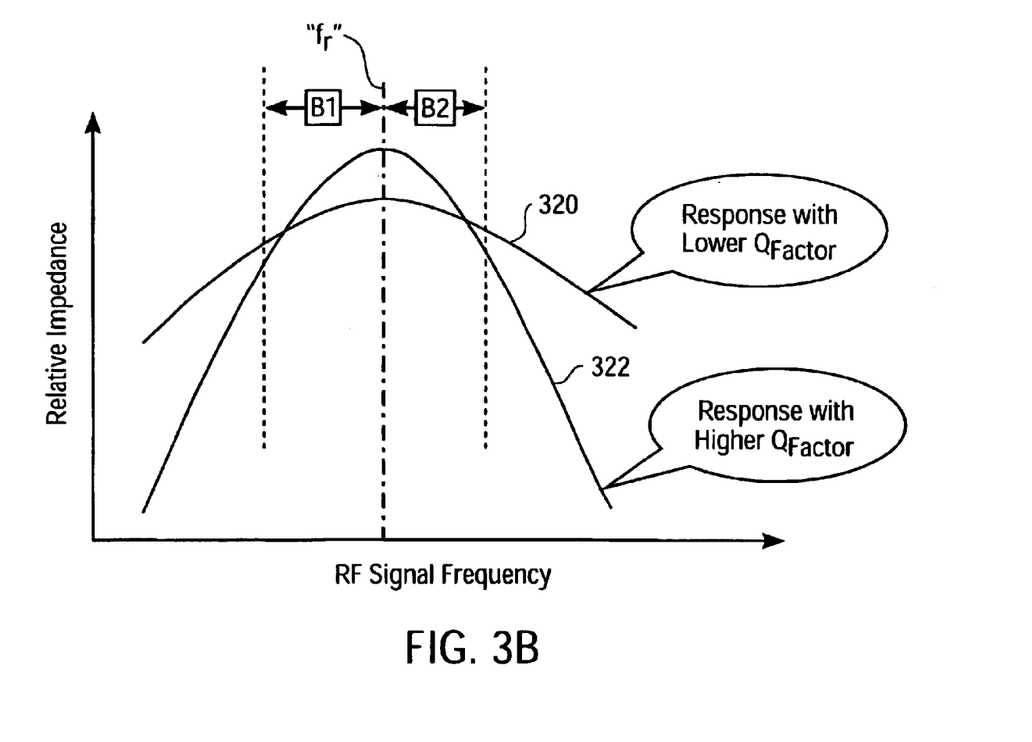
FIG. 3B shows plots of the relative impedance of a parallel resonant circuit as seen by an RF signal in accordance with an embodiment of the present invention.

FIG. 3B shows plots of the relative impedance of circuit 300 as seen by an RF signal. In FIG. 3B, the vertical axis represents the relative impedance of circuit 300 as seen by an RF signal, while the horizontal axis represents the frequency of the RF signal. As shown in FIG. 3B, the impedance of circuit 300 is at a maximum at a resonant frequency $f_r$ given by EQ. 1. Advantageously, the resonant frequency is chosen to be substantially the same as the frequency of the RF signal. When placed close to a non-RF electrode, circuit 300 thus appears as high impedance to an RF signal, thereby preventing RF signal from reaching an electronic module and helping keep RF energy to within the chamber for substrate processing. Using FIG. 2 as an example, employing a circuit 300 as a filter 260 resonant at the RF signal frequency will allow for increased voltage near support member 210. This reaccelerates ions and improves ion bombardment for substrate processing.

As can be appreciated by those of ordinary skill in the art reading the present disdosure, improving RF coupling in a plasma processing system by optimizing a non-RF electrode is also a novel way of thinking about RF configurations in general. Prior to the present disclosure, the conventional approach to improving RF coupling is to optimize RF electrodes (by impedance matching, etc.); with regard to non-RF electrodes, the conventional approach is to shunt stray RF signal to ground with or without a series inductor in a remote area. Conventional approaches to improving RF coupling not only fail to optimize non-RF electrodes, but also raise safety concerns because RF signal may stray out far into a remote location before being shunted to ground.

Referring back to FIG. 3B, the Q-factor of circuit 300 is affected by the inductor series loss resistance From EQ. 2, the Q-factor of circuit 300 becomes lower as the inductor series loss resistance becomes higher. In FIG. 3B, a plot 320 represents the response of a circuit 300 with a relatively low Q-factor, while a plot 322 represents the response of a circuit 300 with a relatively high Q-factor. The Q-factor of a circuit 300 is advantageously setup to attenuate most of the RF signal and little of non-RF signals. In one embodiment, a circuit 300 is configured so that a total bandwidth of "B1" plus "B2" comprises a band of frequencies where attenuation is within 3dB from the resonant frequency. This 3dB range is suitable for non-RF signals having a frequency that is well below the RF signal frequency, which in this case is substantially the same as the resonant frequency.

Figure 4A:
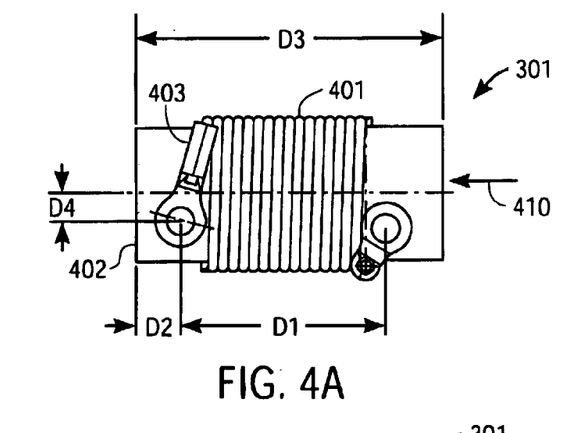
FIGS. 4A and 4B show side views of an inductor in accordance with an embodiment of the present invention.
Figure 4B:
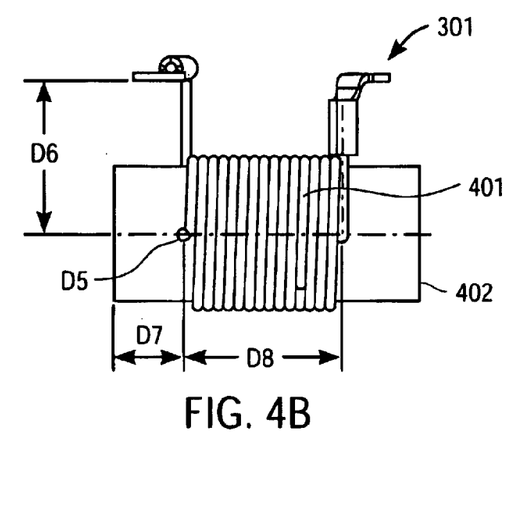
Figure 4C:
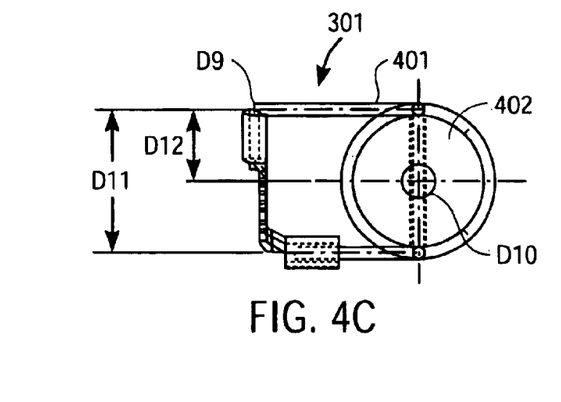
FIG. 4C shows a front view of the inductor of FIG. 4A.
Figure 4D:
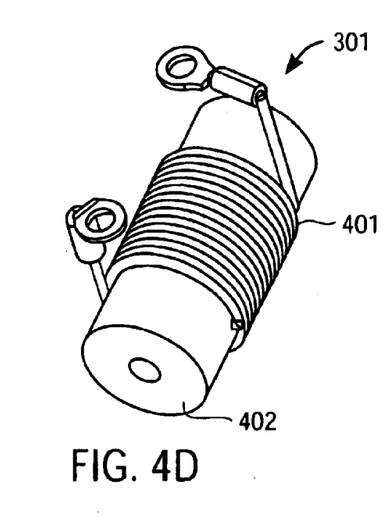
FIG. 4D shows a perspective view of the inductor of FIG. 4A.

FIGS. 4A and 4B show side views of an inductor 301 in accordance with an embodiment of the present invention, while FIG. 4C shows a front view looking in the direction indicated by an arrow 410 in FIG. 4A. FIG. 4D shows a perspective view of the inductor 301 of FIG. 4A. Referring to FIGS. 4A–4D, a wire 401 may be wound on a core 402 to form an inductor 301. In one embodiment, wire 401 is a 16 AWG magnet wire, while core 402 is of a teflon material having an outside diameter of 0.63 inch. A ring lug 403 may be crimped on each end of wire 401. Table 1 shows the dimensions of an inductor 301 in one embodiment (refer to FIGS. 4A–4D).

TABLE 1

Example Dimensions Of An Inductor 301
(Refer to FIGS. 4A–4D)

| Dimension | Value (inch) |
|---|---|
| D1 | 1.06 ± 0.06 |
| D2 | 0.22 |
| D3 | 1.50 |
| D4 | 2 × 0.13 ± 0.06 |
| D5 | 2 × dia. 0.070 THRU |
| D6 | 2 × 0.74, +0.06, −0.00 |
| D7 | 0.35 |
| D8 | 0.77 |
| D9 | 4× min. bend radii (not pictorially exact) |
| D10 | 8–32UNC |
| D11 | 0.70 |
| D12 | 0.35, +0.06, −0.00 |

In one embodiment, an inductor 301 has a value of about 2.02 micro Henry, has an inductor series loss resistance less than about 0.3 Ohm, and is parallel resonant with a 68 pF (pico Farad) capacitor at 13.56 MHZ.

Figure 5A:
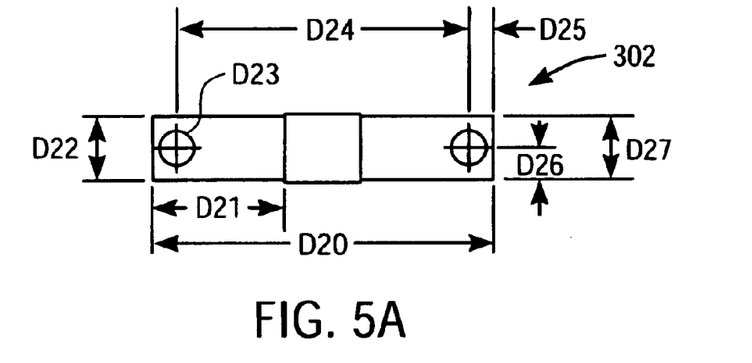
FIGS. 5A and 5B show a top view and a side view, respectively, of a capacitor in accordance with an embodiment of the present invention.
Figure 5B:
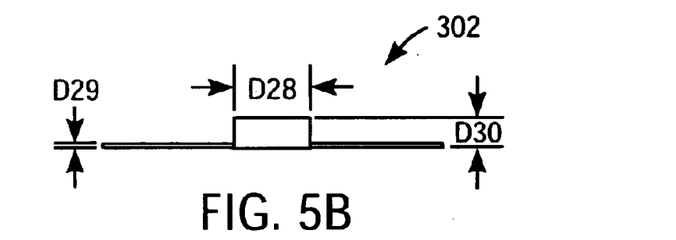

FIGS. 5A and 5B show a top view and a side view, respectively, of a capacitor 302 (see FIG. 3A) in accordance with an embodiment of the present invention. In one embodiment, a capacitor 302 has a value of 68 pF, is rated for 3600V, and has an operating temperature range of −55° C. to +125° C. (degree Centigrade). Such a capacitor is available from American Technical Ceramics, Inc., for example. Table 2 shows the dimensions of a capacitor 302 in one embodiment (refer to FIGS. 5A and 5B).

TABLE 2

Example Dimensions Of A Capacitor 302
(Refer to FIGS. 5A and 5B)

| Dimension | Value (inch) |
|---|---|
| D20 | 1.880 |
| D21 | 0.750 |
| D22 | 0.350 |
| D23 | 2 × dia. 0.194 |
| D24 | 1.61 |
| D25 | 2 × 0.135 |
| D26 | 0.19 |
| D27 | 0.380 |
| D28 | 0.380 |
| D29 | 0.010 |
| D30 | 0.170 |

Figure 6:
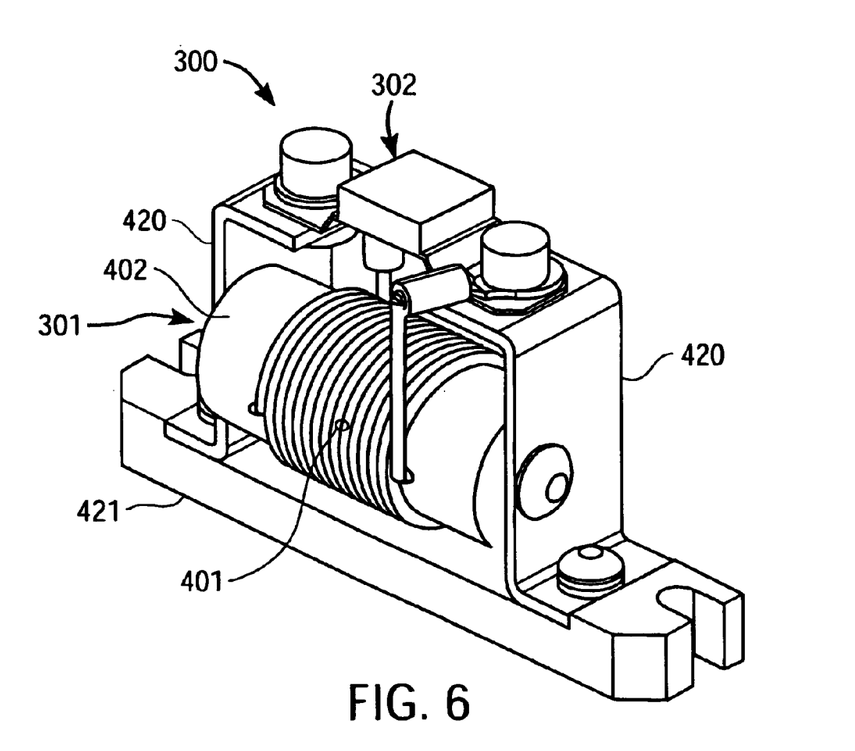
FIG. 6 shows a perspective view of an assembly of an inductor and a capacitor forming a parallel resonant circuit in accordance with an embodiment of the present invention.

FIG. 6 shows a perspective view of an assembly of an inductor 301 and a capacitor 302 forming a circuit 300 in accordance with an embodiment of the present invention. In the example of FIG. 6, an inductor 301 and a capacitor 302 are parallel mounted on a pair of brackets 420. Brackets 420 are in turn mounted on a base 421, which may be mounted in an assembly (not shown) near a non-RF electrode. In one embodiment, a circuit 300 like that shown in FIG. 6 is coupled to a non-RF electrode inside a support member.

Ordinarily, an RF signal is provided a low impedance return path other than through a non-RF electrode to prevent the RF signal from reaching an electronic module. If an RF electrode is electrically floating, RF signal may get induced on a non-RF electrode and propagate on it. Thus, although electrically floating an RF electrode may be advantageous in some applications, conventional RF configurations do not readily allow for an effective means of floating an RF electrode. In accordance with an embodiment of the present invention, an RF electrode may be electrically floated without compromising the functionality of a non-RF electrode and an electronic module coupled to it. This aspect of the present invention is now described with reference to FIG. 7.

Figure 7:
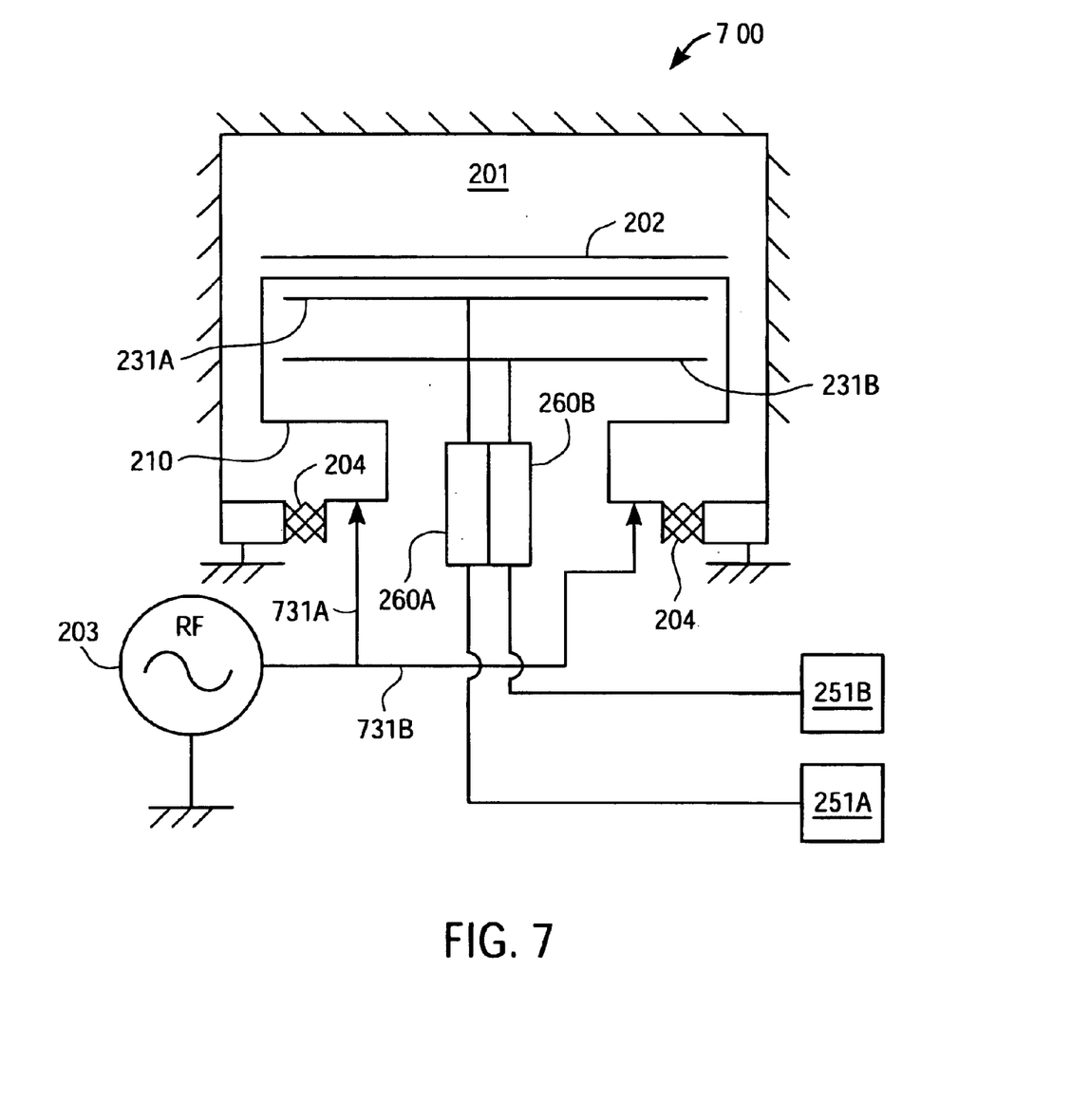
FIGS. 7, 8, and 9 schematically show examples of plasma processing systems in accordance with embodiments of the present invention.

FIG. 7 schematically shows a plasma processing system 700 in accordance with an embodiment of the present invention. System 700 is similar to system 200 shown in FIG. 2 except for the configuration of RF electrodes driven by RF signal source 203. In system 700, support member 210 is driven by RF signal source 203 via transmission media 731 (i.e., 731A, 731B) (e.g., RF cables, straps); that is, support member 210 is serving as an RF electrode. Because insulators 204 electrically isolate support member 210 from the surface of chamber 201, support member 210 serves as an electrically floating RF electrode. Ordinarily, this would make non-RF electrodes 231 appear to an RF signal as low impedance return paths. However, because each filter 260 is configured to be parallel resonant to RF signal frequency in this embodiment, each filter 260 appears as high impedance to an RF signal. As a result, RF signal will instead use the surface of chamber 201 as a return electrode because it has relatively low impedance compared to a non-RF electrode 231. This prevents RF signal from reaching an electronic module 251.

Figure 8:
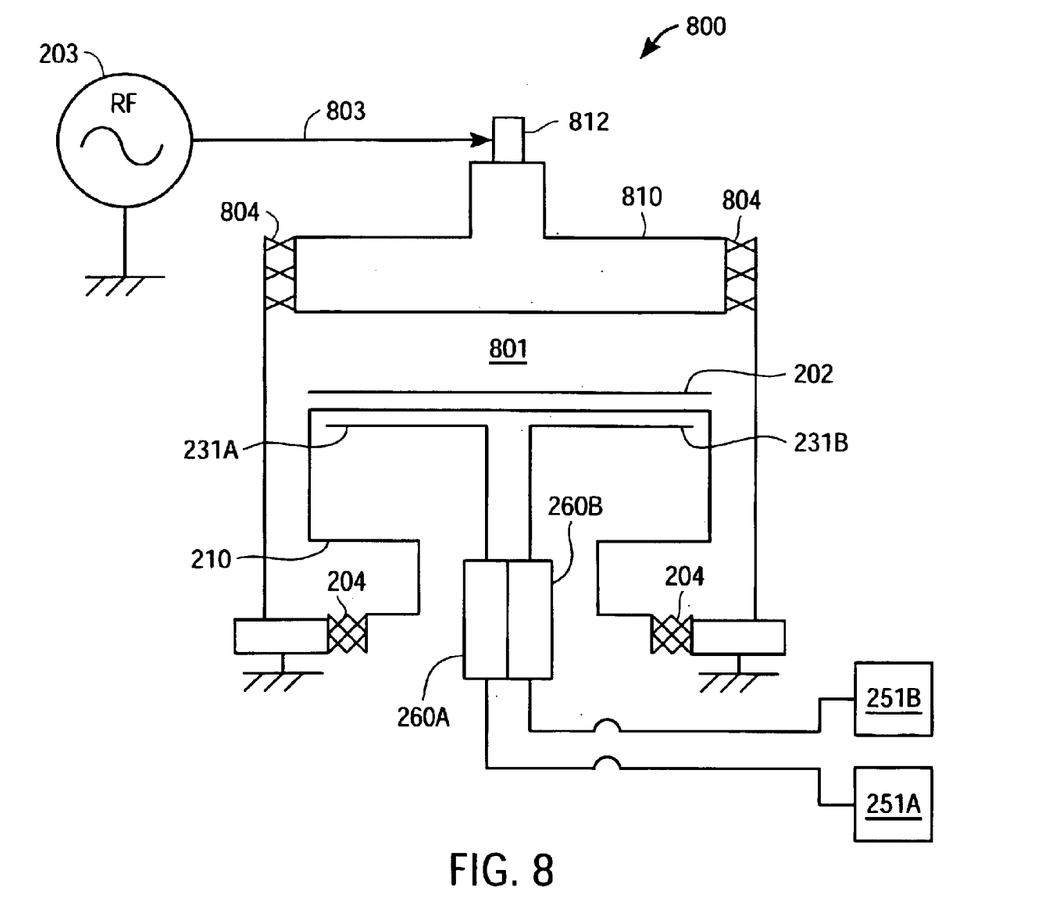

In light of the present disclosure, those of ordinary skill in the art will appreciate that the present invention is applicable to a wide variety of plasma processing systems. In FIG. 8, for example, a plasma processing system 800 in accordance with an embodiment of the present invention includes a shower head 810 above a support member 210. System 800 may be a chemical vapor deposition system, for example. Process gases for substrate processing are introduced into a process chamber 801 via an inlet 812 of shower head 810. Support member 210 supports a wafer 202 under shower head 810. Inside support member 210 are non-RF electrodes 231 that are each coupled to an electronic module 251 via a filter 260. In system 800, a filter 260 is configured to attenuate RF signals while allowing non-RF signals to pass.

In FIG. 8, a transmission media 803 (e.g., RF cable, straps) couples RF signal source 203 to inlet 812. Because inlet 812 is part of (or electrically coupled to) shower head 810, shower head 810 is serving as an RF electrode. Additionally, because insulators 804 (e.g., ceramic insulator) electrically isolate shower head 810 from chamber 801, shower head 810 serves as an electrically floating RF electrode. In system 800, insulators 204 electrically isolate support member 210 from chamber 801.

Each filter 260 in system 800 appears as high impedance to an RF signal. This makes an RF signal use the surface of chamber 801, rather than a non-RF electrode 231, as return path. The high impedance presented by each filter 260 also results in increased voltage near substrate 202. This, in turn, advantageously helps improve ion bombardment for substrate processing, and helps confine plasma between shower head 810 and support member 210.

Figure 9:
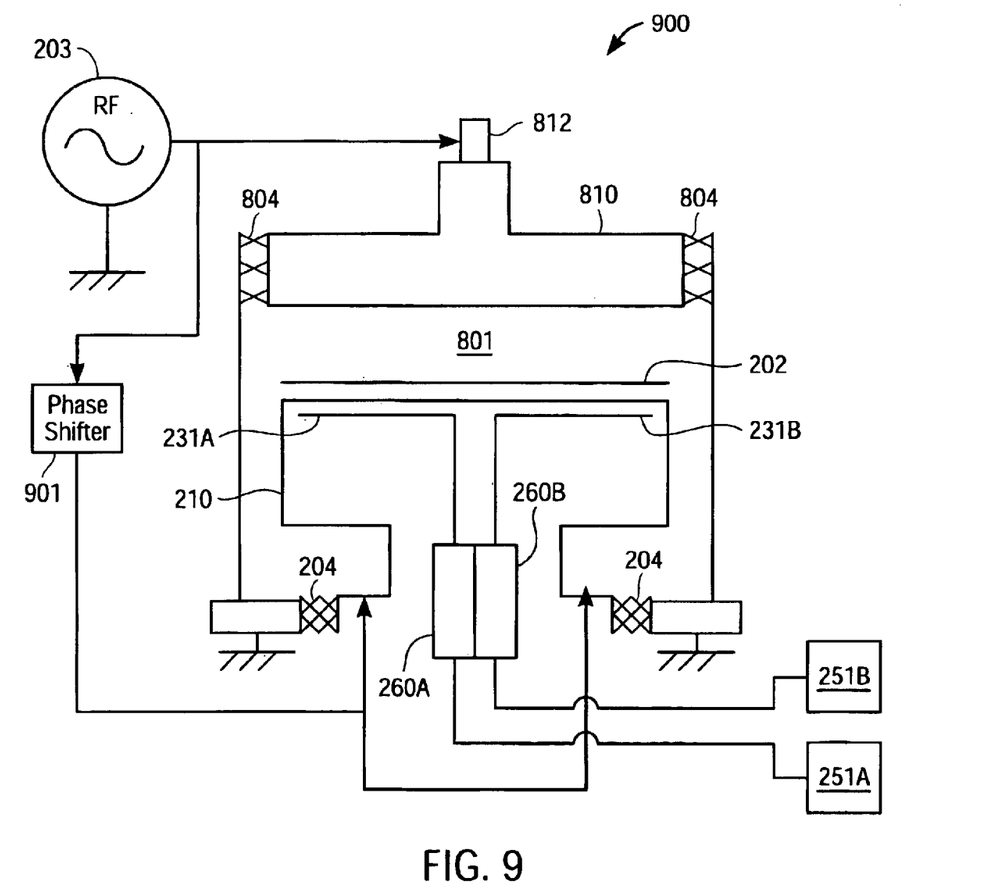

Another example of a plasma processing system in accordance with an embodiment of the present invention is shown in FIG. 9. In FIG. 9, a plasma processing system 900 is similar to system 800 shown in FIG. 8 except for the configuration of the RF electrodes. In system 900, RF signal source 203 couples RF signal to shower head 810. Additionally, RF signal source 203 also couples RF signal to support member 210 via a phase shifter 901. Phase shifter 901 shifts the phase of an RF signal going to shower head 810 and couples it to support member 210. Thus, shower head 810 and support member 210 both serve as RF electrodes in this embodiment. Also, because shower head 810 and support member 210 are both electrically isolated from chamber 801, shower head 810 and support member 210 serve as electrically floating RF electrodes.

Inside support member 210 of system 900 are non-RF electrodes 231 that are each coupled to an electronic module 251 via a filter 260. In system 900, a filter 260 is configured to attenuate RF signals while allowing non-RF signals to pass. Each filter 260 in system 900 appears as high impedance to RF signal. The RF configuration of system 900 advantageously helps confine plasma to between shower 810 and support member 210, improves RF signal utilization in chamber 801, and increases ion bombardment for substrate processing.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A radio frequency (RF) configuration in a plasma processing system, the RF configuration comprising:
   a first electrode coupled to provide RF signal in a process chamber;
   a second electrode coupled to an electronic module; and
   a band stop filter coupled to the second electrode such that the RF signal is substantially prevented from reaching the electronic module via the second electrode the band stop filter being located nearer to the second electrode than to the electronic module.

2. The RF configuration of claim 1 wherein the band stop filter is inside a support member housed in the process chamber.

3. The RF configuration of claim 1 wherein the band stop filter comprises a parallel resonant circuit.

4. The RF configuration of claim 3 wherein a resonant frequency of the band stop filter is substantially the same as the frequency of an RF signal on the first electrode.

5. The RF configuration of claim 1 wherein the band stop filter is connected to an end of the second electrode.

6. The RF configuration of claim 1 wherein the first electrode is electrically floating.

7. The RF configuration of claim 1 wherein the second electrode is closer to a substrate than the first electrode.

8. The RF configuration of claim 1 wherein the first electrode comprises a support member.

9. The RF configuration of claim 1 wherein the first electrode comprises a shower head.

10. A method of providing radio frequency (RF) signal in a plasma processing system, the method comprising:
    coupling an RF signal to a process chamber; and
    presenting an impedance to the RF signal such that the RF signal does not propagate to an electronic module coupled to a non-RF electrode, the impedance being at a maximum at a frequency within a band of frequencies.

11. The method of claim 10 wherein the non-RF electrode is inside a support member.

12. The method of claim 10 wherein the RF signal is on an electrically floating RF electrode.

13. The method of claim 10 wherein presenting the impedance to the RF signal comprises providing a band stop filter at an end of the non-RF electrode.

14. The method of claim 13 wherein the band stop filter comprises a parallel resonant circuit.

15. The method of claim 10 wherein the frequency is substantially the same as that of the RF signal.

16. The method of claim 10 wherein presenting the impedance to the RF signal comprises coupling a band stop filter to the non-RF electrode.

17. The method of claim 10 wherein the non-RF electrode is closer to a substrate than an RF electrode.

18. A configuration for providing radio frequency (RF) signal in a plasma processing system, the configuration comprising:
    means for coupling an RF signal to a process chamber; and
    means for presenting an impedance to the RF signal, the impedance being at a maximum at a frequency near a frequency of the RF signal.

19. The configuration of claim 18 wherein the means for presenting an impedance to the RF signal comprises a band stop filter.

20. The configuration of claim 18 wherein the means for coupling an RF signal to a process chamber comprises an electrically floating RF electrode.

* * * * *